United States Patent
Shulver

(10) Patent No.: US 9,633,866 B2
(45) Date of Patent: Apr. 25, 2017

(54) METHOD FOR PATTERNING OF LAMINATED MAGNETIC LAYER

(71) Applicant: Texas Instruments Incorporated, Dallas, TX (US)

(72) Inventor: Byron J R Shulver, Kilmacolm, PA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 9 days.

(21) Appl. No.: 14/715,546

(22) Filed: May 18, 2015

(65) Prior Publication Data

US 2016/0343586 A1 Nov. 24, 2016

(51) Int. Cl.
| H01L 21/3213 | (2006.01) |
| H01L 23/532 | (2006.01) |
| H01L 21/768 | (2006.01) |
| H01L 23/522 | (2006.01) |
| H01L 23/64 | (2006.01) |
| H01L 43/12 | (2006.01) |

(52) U.S. Cl.
CPC .. *H01L 21/32134* (2013.01); *H01L 21/32139* (2013.01); *H01L 21/76802* (2013.01); *H01L 21/76877* (2013.01); *H01L 23/5227* (2013.01); *H01L 23/5329* (2013.01); *H01L 23/53238* (2013.01); *H01L 23/645* (2013.01); *H01L 43/12* (2013.01)

(58) Field of Classification Search
CPC ............. H01L 21/32134; H01L 23/645; H01L 23/5329; H01L 23/5227; H01L 21/76802; H01L 23/53238; H01L 43/12; H01L 21/76877; H01L 21/32139
See application file for complete search history.

(56) References Cited

U.S. PATENT DOCUMENTS

| 2001/0006246 | A1* | 7/2001 | Kwag | C09K 13/04 257/522 |
| 2002/0036315 | A1* | 3/2002 | Adachi | B82Y 25/00 360/324.2 |
| 2002/0090534 | A1* | 7/2002 | Shirasaki | B82Y 25/00 428/811.3 |
| 2002/0132136 | A1* | 9/2002 | Roshen | B32B 7/02 428/810 |
| 2006/0014305 | A1* | 1/2006 | Lee | H01L 27/222 438/3 |
| 2010/0120248 | A1* | 5/2010 | Fath | C09K 3/1463 438/692 |

* cited by examiner

*Primary Examiner* — Kyoung Lee
(74) *Attorney, Agent, or Firm* — Jacqueline J. Garner; Charles A. Brill; Frank D. Cimino

(57) ABSTRACT

A microelectronic device is formed by forming a stack of alternating layers of a magnetic material and a dielectric material. An etch mask is formed over the magnetic laminate layer. An aqueous wet etch including 5 percent to 10 percent nitric acid, 0.5 percent to 2 percent sulphuric acid, and 0.5 percent to 3 percent hydrofluoric acid is used to etch the magnetic laminate layer where exposed by the etch mask to form a patterned magnetic laminate layer. An optional adhesion layer, if present, is also removed by the aqueous wet etch solution where exposed by the etch mask. The etch mask is subsequently removed.

18 Claims, 6 Drawing Sheets

METHOD FOR PATTERNING OF LAMINATED MAGNETIC LAYER

FIELD OF THE INVENTION

This invention relates to the field of microelectronic devices. More particularly, this invention relates to laminated magnetic layers in microelectronic devices.

BACKGROUND OF THE INVENTION

An inductor formed by planar processing includes a magnetic core layer of a laminate of alternating layers of magnetic material and dielectric, to reduce eddy current losses. The magnetic material includes at least 80 percent cobalt, at least 1 percent tantalum and at least 1 percent zirconium. Patterning the magnetic laminate layer has been problematic. Wet etch processes leave residue and degrade exposed copper interconnects. Dry etch processes such as ion milling have high manufacturing costs.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device containing a patterned magnetic laminate layer is formed by forming an etch mask over the magnetic laminate layer and removing the magnetic laminate layer exposed by the etch mask using an aqueous wet etch including 5 percent to 10 percent nitric acid, 0.5 percent to 2.0 percent sulphuric acid, and 0.5 percent to 3 percent hydrofluoric acid. The etch mask is subsequently removed.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A microelectronic device has a dielectric substrate, possibly with exposed copper interconnects. An optional adhesion layer may be formed on the substrate. A magnetic laminate layer of alternating layers of magnetic material and dielectric material, with at least two layers of the magnetic material and at least one layer of the dielectric material, is formed over the substrate. An etch mask is formed over the magnetic laminate layer to cover an area for a patterned magnetic laminate layer. The magnetic laminate layer is removed in areas exposed by the etch mask using an aqueous wet etch. The wet etch includes 5 percent to 10 percent nitric acid, 0.5 percent to 2.0 percent sulphuric acid, and 0.5 percent to 3 percent hydrofluoric acid. The wet etch may be, for example, an immersion process or a spray process. The patterned magnetic laminate layer may be part of an inductor, a transformer, a magnetic sensor, or other magnetic device, which may be formed by planar processing.

Figure 1A:
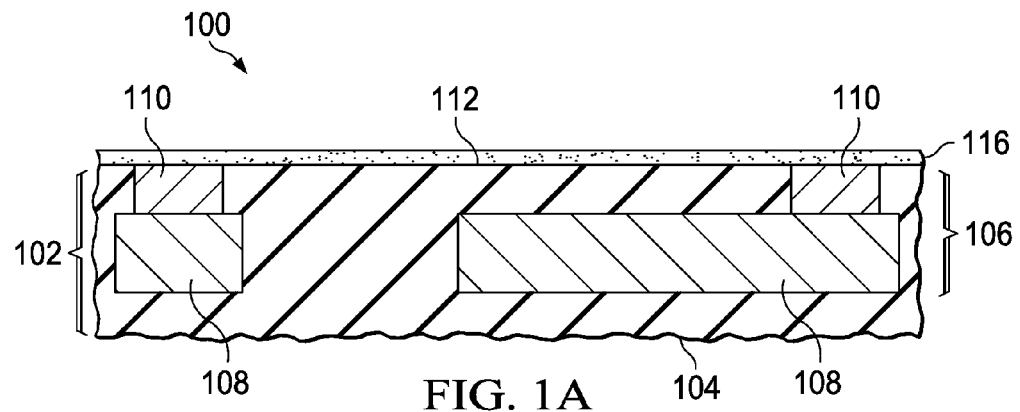
FIG. 1A through FIG. 1G are cross sections of an example microelectronic device containing a patterned magnetic laminate layer, depicted in successive stages of fabrication.

FIG. 1A through FIG. 1G are cross sections of an example microelectronic device containing a patterned magnetic laminate layer, depicted in successive stages of fabrication. Referring to FIG. 1A, the microelectronic device 100 is formed on a substrate 102 comprising a dielectric material 104 such as silicon dioxide. The substrate 102 may be, for example, an integrated circuit on a semiconductor wafer and the dielectric material 104 may be part of an interconnect structure of the integrated circuit above semiconductor material in the semiconductor wafer.

The substrate 102 may contain metal interconnects 106. The metal interconnects 106 may include copper lines 108 and/or copper vias 110 formed by masked electroplating. Some of the metal interconnects 106, for example the copper vias 110, may extend to a top surface 112 of the substrate 102.

An optional adhesion layer 116 may be formed on the top surface 112. The adhesion layer 116 may be, for example, 1 nanometer to 1000 nanometers thick, and may include, for example, titanium, titanium nitride, tantalum, and/or tantalum nitride. The adhesion layer 116 may be formed by sputtering or reactive sputtering.

Figure 1B:
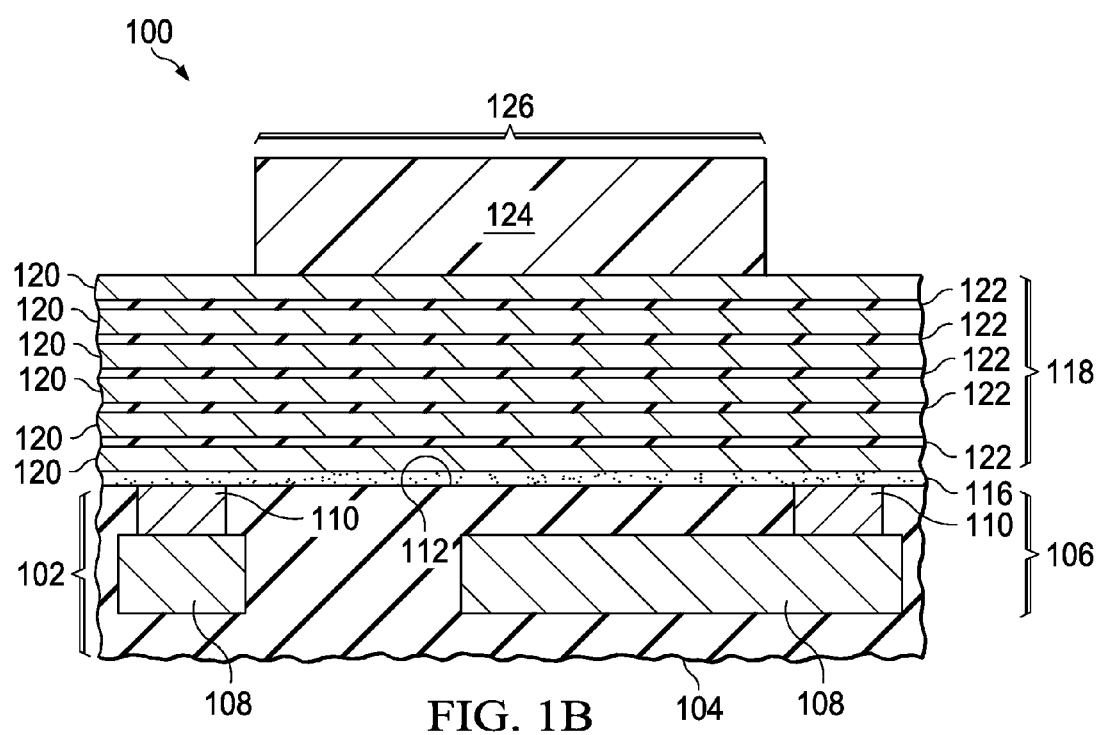

Referring to FIG. 1B, a magnetic laminate layer 118 is formed over the substrate 102, on the adhesion layer 116 if present. The magnetic laminate layer 118 includes layers of magnetic material 120 alternating with layers of dielectric material 122, with at least two layers of the magnetic material 120 and at least one layer of the dielectric material 122. The layers of dielectric material 122 may reduce eddy currents in the magnetic laminate layer 118 during operation of the microelectronic device 100. The magnetic laminate layer 118 may include at least five layers of the magnetic material 120 and at least five layers of the dielectric material 122. The magnetic material 120 may include, for example, at least 80 percent cobalt, at least 1 percent tantalum and at least 1 percent zirconium. The layers of the magnetic material 120 may be formed by sputtering, and may be, for example, 0.5 microns to 1.5 microns thick. Other compositions of the magnetic material 120 are within the scope of the instant example. The dielectric material 122 may be primarily aluminum nitride, formed by reactive sputtering. Forming both the layers of the magnetic material 120 and the layers of dielectric material 122 by sputtering processes may improve fabrication throughput of the microelectronic device 100 and thus advantageously reduce manufacturing cost. The layers of the dielectric material 122 may be, for example, 1 nanometer to 1000 nanometers thick. Other compositions of the dielectric material 122 are within the scope of the instant example.

An etch mask 124 is formed over the magnetic laminate layer 118 so as to cover an area for the patterned magnetic laminate layer 126 and expose the magnetic laminate layer 118 outside the area for the patterned magnetic laminate layer 126. The etch mask 124 may include photoresist formed by a photolithographic process. The etch mask 124 may further include an anti-reflection layer, not shown in FIG. 1B.

Figure 1C:
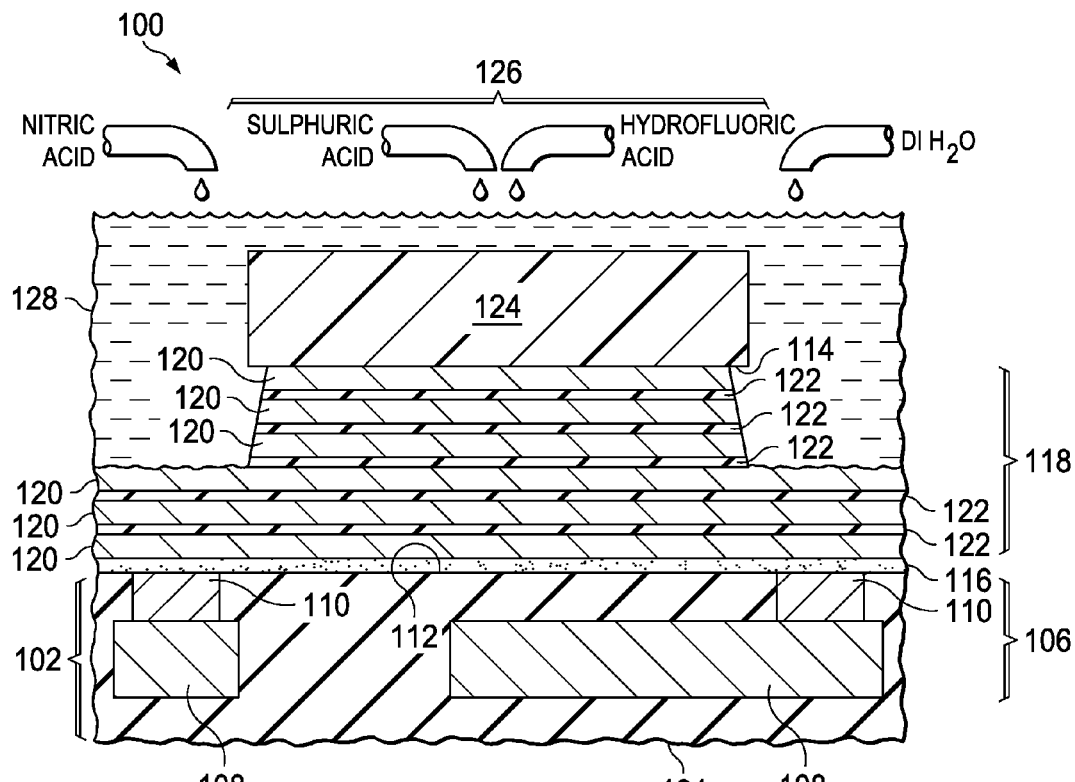

Referring to FIG. 1C, the magnetic laminate layer 118 is removed in the areas exposed by the etch mask 124 by immersing the magnetic laminate layer 118 in an aqueous wet etch solution 128. FIG. 1C depicts the removal process partway to completion. The aqueous wet etch solution 128 comprises 5 percent to 10 percent nitric acid, 0.5 percent to 2.0 percent sulphuric acid, 0.5 percent to 3 percent hydrofluoric acid, and at least 80 percent deionized water (DI $H_2O$). Inclusion other materials such as surfactants which do not directly remove the magnetic laminate layer 118 is within the scope of the instant example. The nitric acid is effective for removing the layers of the magnetic material 120 and the layers of the dielectric material 122. Using a concentration of the nitric acid less than 5 percent disadvantageously reduces throughput of the removal process and may unacceptably increase manufacturing cost of the microelectronic device 100. Using a concentration of the nitric acid above 10 percent disadvantageously degrades the etch mask 124 and may unacceptably increase undercut 114 of the patterned magnetic laminate layer 126. The sulphuric acid is effective for reducing degradation of the exposed copper vias 110. Concentrations of the sulphuric acid below 0.5 percent and above 2 percent are not effective for reducing degradation of the exposed copper vias 110. The hydrofluoric acid is effective for removing the adhesion layer 116. Using a concentration of the hydrofluoric acid below 0.5 percent is not effective for removing the adhesion layer 116. Using a concentration of the hydrofluoric acid above 3 percent disadvantageously reduces control of overetch of the dielectric material 104 in the substrate 102. The aqueous wet etch solution 128 may be at a temperature of 20° C. to 25° C. Maintaining the aqueous wet etch solution 128 at a temperature below 20° C. may require cooling the aqueous wet etch solution 128, disadvantageously increasing complexity and cost of equipment containing the aqueous wet etch solution 128. Maintaining the aqueous wet etch solution 128 at a temperature above 25° C. disadvantageously increases difficulty of determining completion of the removal of the magnetic laminate layer 118 while maintaining overetch dielectric material 104 at a desired value.

Figure 1D:
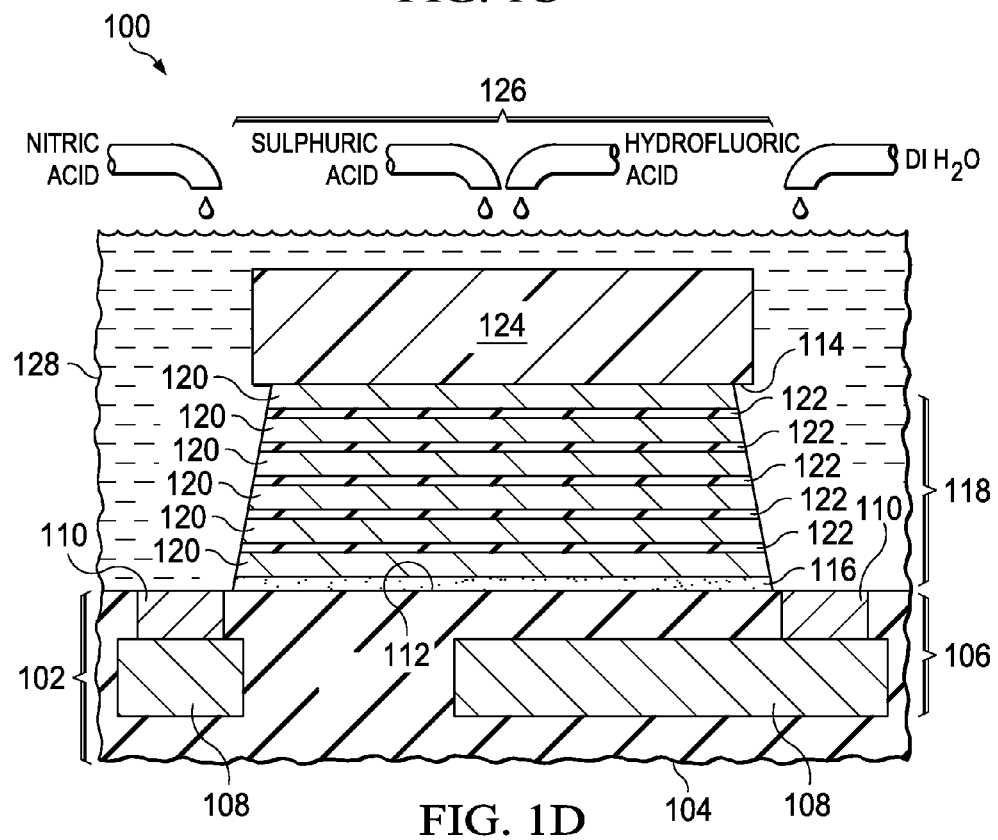

Referring to FIG. 1D, removal of the magnetic laminate layer 118 in the areas exposed by the etch mask 124 by the aqueous wet etch solution 128 is completed. The adhesion layer 116, if present, is removed by the aqueous wet etch solution 128. The concentration of the hydrofluoric acid in the aqueous wet etch solution 128 may be selected to provide an acceptable overetch of the dielectric material 104 in the substrate 102. The microelectronic device 100 is subsequently removed from the aqueous wet etch solution 128 and rinsed.

Figure 1E:
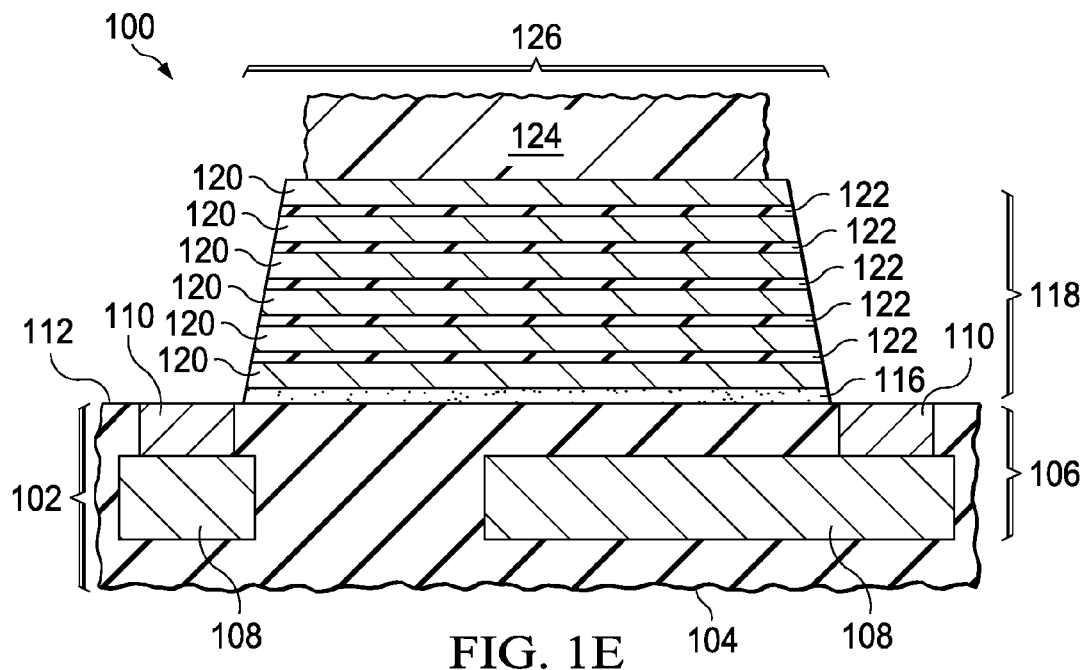

Referring to FIG. 1E, the etch mask 124 is removed. The etch mask 124 may be removed, for example, by immersion in a solvent mixture and/or by an ash process. FIG. 1E depicts the removal process partway to completion.

Figure 1F:
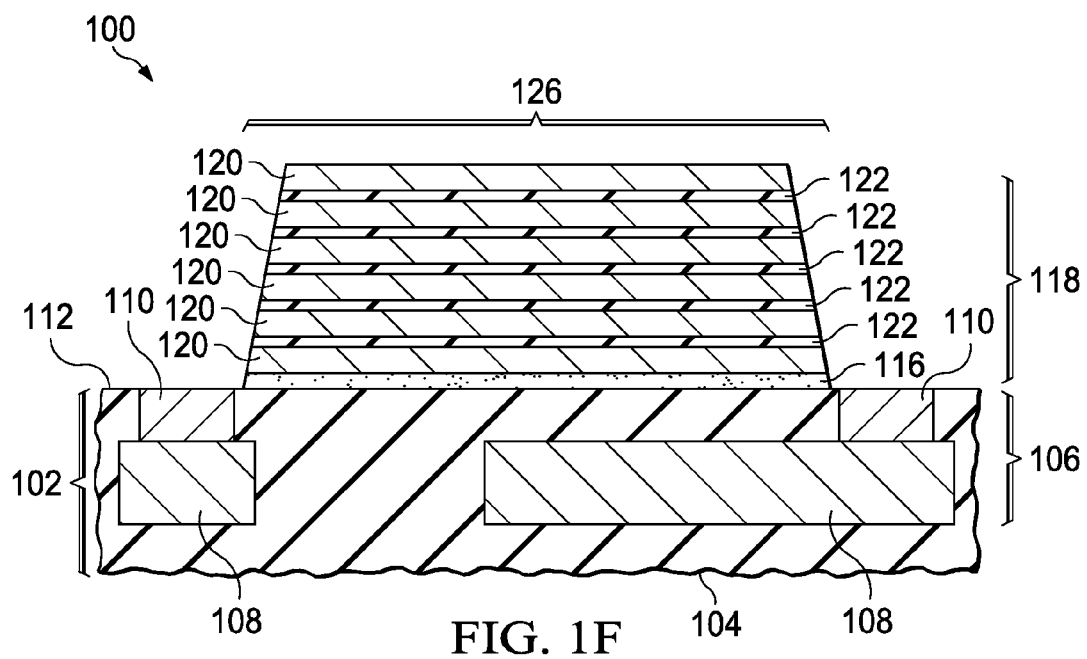

FIG. 1F depicts the microelectronic device 100 after the etch mask is removed. In some versions of the microelectronic device 100, fabrication may be substantially completed after the patterned magnetic laminate layer 126 is formed. In other versions, additional elements of the microelectronic device 100 are formed after the patterned magnetic laminate layer 126 is formed.

Figure 1G:
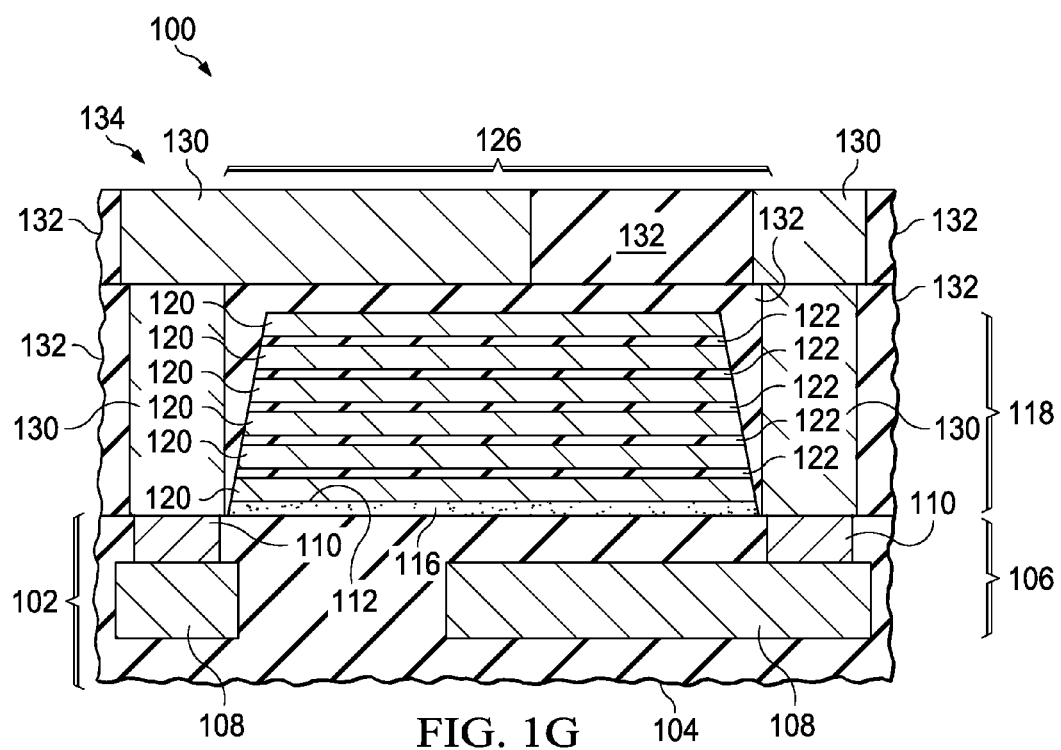

Referring to FIG. 1G, additional metal interconnect elements 130 and dielectric layers 132 are formed on the microelectronic device 100. The additional metal interconnect elements 130 may be formed, for example, by electroplating copper through a plating mask. Alternatively, the additional metal interconnect elements 130 may be formed by depositing metallization layers including aluminum and forming etch masks over the metallization layers and etching the aluminum by a reactive ion etch (RIE) process using chlorine radicals. The additional dielectric layers 132 may be formed, for example, using methylsilsesquioxane (MSQ) in a spin-on process, or using tetraethoxysilane, also known as tetraethyl orthosilicate (TEOS), in a plasma enhanced chemical vapor deposition (PECVD) process, or using dichlorosilane in an sub-atmospheric pressure chemical vapor deposition (SACVD) process. The copper lines 108, copper vias 110 and additional metal interconnect elements 130 may provide windings 134 of a solenoid inductor or a transformer around the patterned magnetic laminate layer 126. The windings 134 combined with the patterned magnetic laminate layer 126 may be part of a magnetic sensor.

Figure 2A:
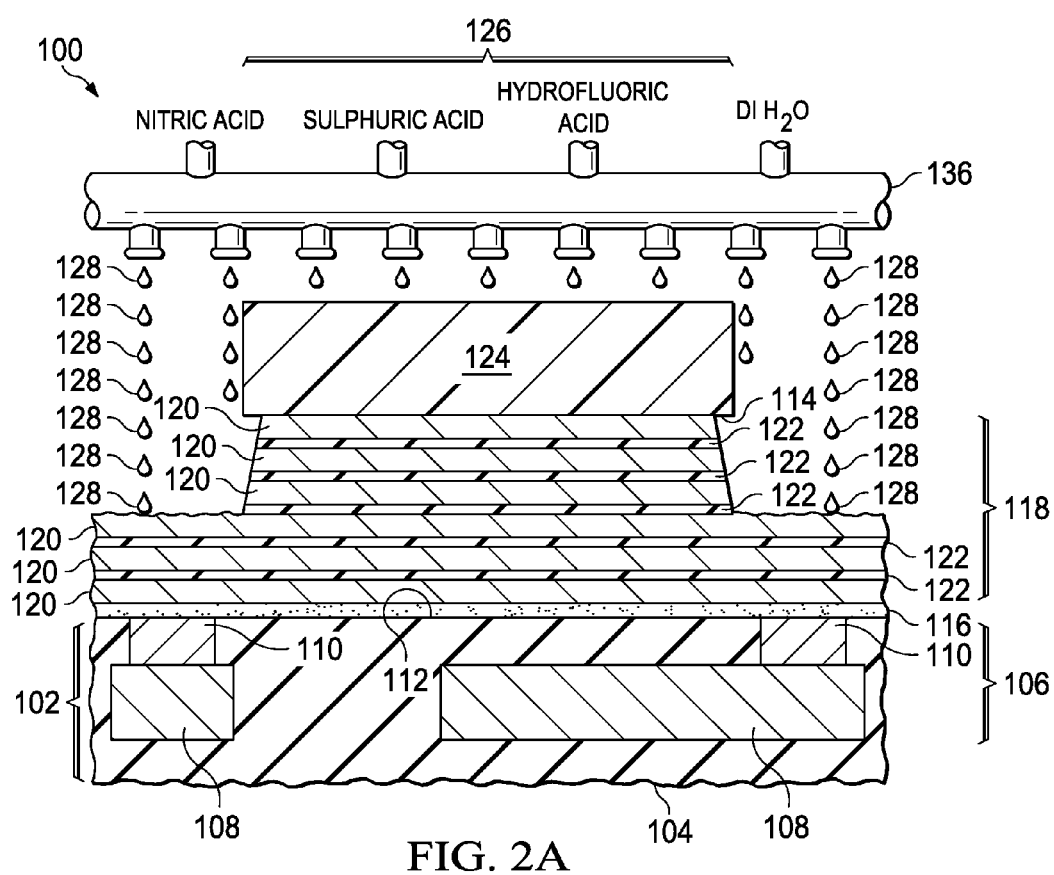
FIG. 2A and FIG. 2B are cross sections of the example microelectronic device of FIG. 1A through FIG. 1G, depicted in key stages of an alternate fabrication sequence.
Figure 2B:
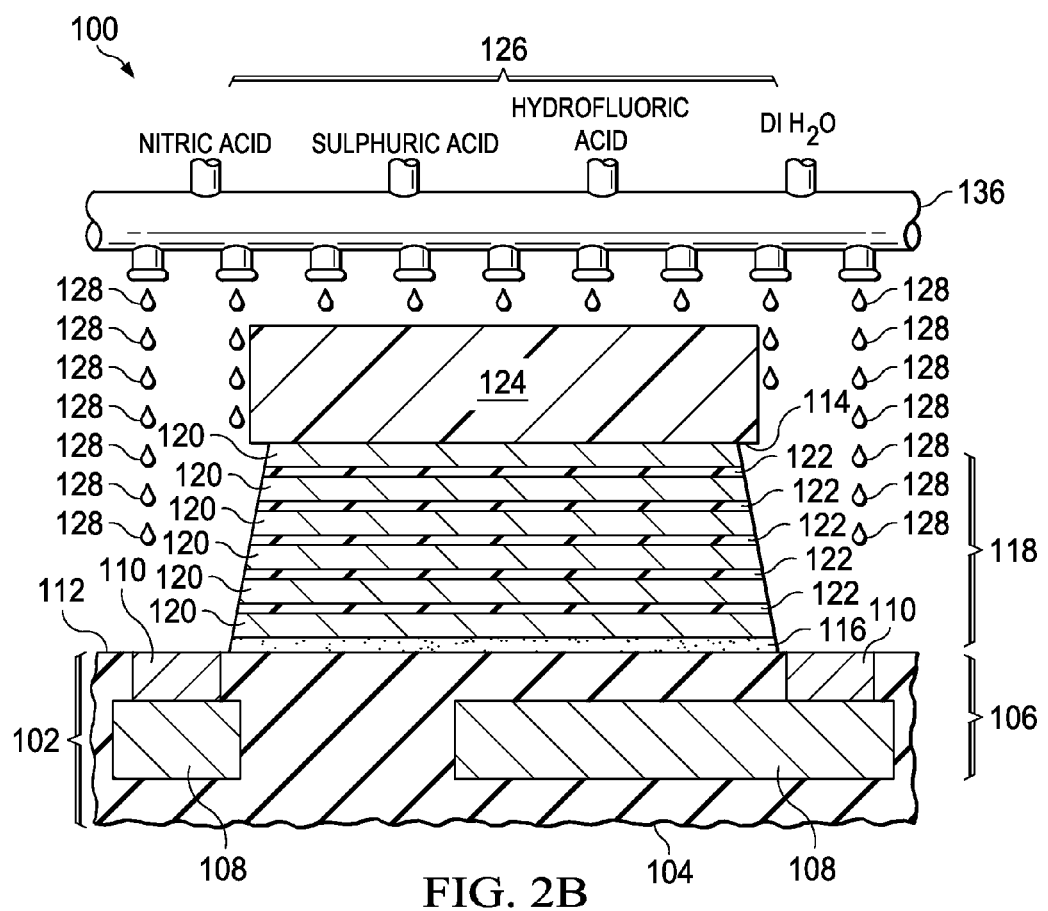

FIG. 2A and FIG. 2B are cross sections of the example microelectronic device of FIG. 1A through FIG. 1G, depicted in key stages of an alternate fabrication sequence. Referring to FIG. 2A, the etch mask 124 is formed over the magnetic laminate layer 118. The aqueous wet etch solution 128 is sprayed onto the magnetic laminate layer 118 by a spray etch tool 136, for example an FSI Mercury Wet Process System or a Semitool Spray Acid Tool. The aqueous wet etch solution 128 may be at a temperature of 20° C. to 25° C., to accrue the advantages described in reference to FIG. 1C. Use of the spray etch tool 136 may reduce the undercut 114 and hence improve performance of the microelectronic device 100. Use of the spray etch tool 136 may reduce consumption of the aqueous wet etch solution 128 and thus advantageously reduce fabrication cost of the microelectronic device 100. FIG. 2A depicts the removal process partway to completion.

Referring to FIG. 2B, removal of the magnetic laminate layer 118 in the areas exposed by the etch mask 124 by the aqueous wet etch solution 128 is completed. The adhesion layer 116, if present, is removed by the aqueous wet etch solution 128. The microelectronic device 100 may be rinsed in the spray etch tool 136. Fabrication of the microelectronic device 100 continues as described in reference to FIG. 1E through FIG. 1G.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of forming a microelectronic device, comprising the steps:

providing a substrate comprising a dielectric material;

forming a magnetic laminate layer over the substrate, the magnetic laminate layer comprising at least two layers of magnetic material alternating with at least one layer of dielectric material, wherein the magnetic material in the magnetic laminate layer includes at least 80 percent cobalt, at least 1 percent tantalum and at least 1 percent zirconium;

forming an etch mask over the magnetic laminate layer;

removing the magnetic laminate layer in areas exposed by the etch mask using an aqueous wet etch solution comprising nitric acid, sulphuric acid, hydrofluoric acid, and deionized water, to form a patterned magnetic laminate layer; and subsequently removing the etch mask.

2. The method of claim 1, wherein removing the magnetic laminate layer is performed by immersing the magnetic laminate layer in the aqueous wet etch solution.

3. The method of claim 1, wherein removing the magnetic laminate layer is performed by spraying the aqueous wet etch solution onto the magnetic laminate layer.

4. The method of claim 1, wherein removing the magnetic laminate layer is performed with the aqueous wet etch solution at a temperature of 20° C. to 25° C.

5. The method of claim 1, wherein each layer of the magnetic material in the magnetic laminate layer is 0.5 microns to 1.5 microns thick.

6. The method of claim 1, wherein the dielectric material in the magnetic laminate layer includes aluminum nitride.

7. The method of claim 1, wherein each layer of the dielectric material in the magnetic laminate layer is 1 nanometer to 1000 nanometers thick.

8. The method of claim 1, wherein the magnetic laminate layer includes at least five layers of the magnetic material and at least five layers of the dielectric material.

9. The method of claim 1, wherein the dielectric material in the substrate includes silicon dioxide.

10. The method of claim 1, wherein the substrate contains a metal interconnect comprising copper.

11. The method of claim 10, wherein the metal interconnect comprising copper extends to a top surface of the substrate.

12. The method of claim 1, comprising forming an adhesion layer over the substrate before forming the magnetic laminate layer, and wherein the adhesion layer is removed by the aqueous wet etch solution.

13. The method of claim 12, wherein the adhesion layer comprises a material selected from the group consisting of titanium, titanium nitride, tantalum and tantalum nitride.

14. The method of claim 1, comprising forming a dielectric layer over the patterned magnetic laminate layer, after removing the etch mask.

15. The method of claim 14, comprising forming metal interconnect elements on the microelectronic device, after removing the etch mask.

16. The method of claim 15, wherein the metal interconnect elements and the patterned magnetic laminate layer are parts of a component selected from the group consisting of a solenoid inductor, a transformer and a magnetic sensor.

17. A method of forming a microelectronic device, comprising the steps:

providing a substrate comprising a dielectric material, the substrate containing an interconnect comprising copper extending to a top surface of the substrate;

forming an adhesion layer over the substrate, the adhesion layer comprising a material selected from the group consisting of titanium, titanium nitride, tantalum and tantalum nitride;

forming a magnetic laminate layer over the substrate, the magnetic laminate layer comprising at least two layers of magnetic material 0.5 microns to 1.5 microns thick alternating with at least one layer of dielectric material 1 nanometer to 1000 nanometers thick, the magnetic material including at least 80 percent cobalt, at least 1 percent tantalum and at least 1 percent zirconium, and the dielectric material including aluminum nitride;

forming an etch mask over the magnetic laminate layer;

removing the magnetic laminate layer and the adhesion layer in areas exposed by the etch mask by immersing the magnetic laminate layer in an aqueous wet etch solution comprising 5 percent to 10 percent nitric acid, 0.5 percent to 2.0 percent sulphuric acid, 0.5 percent to 3 percent hydrofluoric acid, and at least 80 percent deionized water, to form a patterned magnetic laminate layer, the aqueous wet etch solution being at a temperature of 20° C. to 25° C.;

subsequently removing the etch mask;

forming a dielectric layer over the patterned magnetic laminate layer after removing the etch mask; and forming metal interconnect elements on the microelectronic device after removing the etch mask.

18. A method of forming a microelectronic device, comprising the steps:

providing a substrate comprising a dielectric material;

forming an adhesion layer over the substrate;

forming a magnetic laminate layer over the substrate, the magnetic laminate layer comprising at least two layers of magnetic material 0.5 microns to 1.5 microns thick alternating with at least one layer of dielectric material 1 nanometer to 1000 nanometers thick, the magnetic material including at least 80 percent cobalt, at least 1 percent tantalum and at least 1 percent zirconium, and the dielectric material including aluminum nitride;

forming an etch mask over the magnetic laminate layer;

removing the magnetic laminate layer and the adhesion layer in areas exposed by the etch mask by immersing the magnetic laminate layer in an aqueous wet etch solution comprising 5 percent to 10 percent nitric acid, 0.5 percent to 2 percent sulphuric acid, 0.5 percent to 3 percent hydrofluoric acid, and at least 80 percent deionized water, to form a patterned magnetic laminate layer, the aqueous wet etch solution being at a temperature of 20° C. to 25° C.; and subsequently removing the etch mask.

* * * * *